(12) United States Patent
He et al.

(10) Patent No.: US 11,587,931 B2
(45) Date of Patent: Feb. 21, 2023

(54) MULTIPLEXOR FOR A SEMICONDUCTOR DEVICE

(71) Applicant: Micron Technology, Inc., Boise, ID (US)

(72) Inventors: Yuan He, Boise, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/190,705

(22) Filed: Mar. 3, 2021

(65) Prior Publication Data
US 2022/0285351 A1    Sep. 8, 2022

(51) Int. Cl.
*G11C 5/00* (2006.01)
*H01L 27/108* (2006.01)
(Continued)

(52) U.S. Cl.
CPC .......... *H01L 27/10805* (2013.01); *G11C 5/10* (2013.01); *G11C 11/4023* (2013.01);
(Continued)

(58) Field of Classification Search
CPC ......... H01L 27/11582; H01L 27/11556; H01L 27/11573; H01L 27/11529; H01L 25/18; H01L 23/5226; H01L 27/0688; H01L 25/50; H01L 27/11565; H01L 2224/08145; H01L 24/05; H01L 21/8221; H01L 21/823807; H01L 21/823814; H01L 21/823871; H01L 21/823885; H01L 25/0657; H01L 27/092; H01L 27/1052;
(Continued)

(56) References Cited

U.S. PATENT DOCUMENTS 10,109,679 B2    10/2018    Chen et al.
10,418,417 B1    9/2019    Oh et al.
(Continued)

FOREIGN PATENT DOCUMENTS

| CN | 108431979 A | 8/2018 |
|---|---|---|
| KR | 10-2019-0108752 A | 9/2019 |
| KR | 10-2020-0112976 A | 10/2020 |

OTHER PUBLICATIONS

International Search Report and Written Opinion from related International Patent Application No. PCT/US2021/061537, dated Mar. 31, 2022, 12 pages.

*Primary Examiner* — Thong Q Le
(74) *Attorney, Agent, or Firm* — Brooks, Cameron & Huebsch, PLLC

(57) ABSTRACT

A memory device can comprise an array of memory cells comprising a plurality of vertically stacked tiers of memory cells, a respective plurality of horizontal access lines coupled to each of the plurality of tiers, and a plurality of vertical sense lines coupled to each of the plurality of tiers. The array of memory cells can further comprise a plurality of multiplexors each coupled to a respective vertical sense line and configured to electrically couple the respective vertical sense line to a horizontal sense line. The memory device can also comprise a semiconductor under the array (SuA) circuitry, comprising a plurality of sense amplifiers, each sense amplifier coupled to a respective subset of the plurality of multiplexors.

20 Claims, 11 Drawing Sheets

(51) Int. Cl.
 *G11C 11/4096* (2006.01)
 *G11C 11/4091* (2006.01)
 *H01L 27/06* (2006.01)
 *G11C 5/10* (2006.01)
 *G11C 11/402* (2006.01)

(52) U.S. Cl.
 CPC ...... *G11C 11/4091* (2013.01); *G11C 11/4096* (2013.01); *H01L 27/0688* (2013.01)

(58) Field of Classification Search
 CPC ......... H01L 27/11524; H01L 27/11575; H01L 29/0642; H01L 29/42392; H01L 29/6675; H01L 29/78642; H01L 29/78696; H01L 2924/1431; H01L 2224/80895; H01L 2224/80896; H01L 24/08; H01L 24/80; H01L 27/11519; H01L 21/76877; H01L 2224/05647; H01L 2225/06524; G11C 7/12; G11C 29/1201; G11C 29/14; G11C 29/42; G11C 29/44; G11C 29/4401; G11C 29/72; G11C 29/81; G11C 5/145; G11C 5/147; G11C 7/10; G11C 8/08; G11C 8/10; G11C 7/18; G11C 16/0483; G11C 16/24; G11C 5/06; G11C 16/08
 USPC .............................. 365/51, 63, 163, 189.15
 See application file for complete search history.

(56) References Cited

U.S. PATENT DOCUMENTS

| | | | |
|---|---|---|---|
| 10,607,995 | B2 | 3/2020 | Roberts et al. |
| 10,672,456 | B2 * | 6/2020 | Fishburn ............. H01L 27/0688 |
| 11,386,948 | B1 * | 7/2022 | He ....................... G11C 11/4091 |
| 2016/0284764 | A1 | 9/2016 | Mine |
| 2018/0159033 | A1 | 6/2018 | Wu et al. |
| 2018/0323200 | A1 | 11/2018 | Tang et al. |
| 2019/0103406 | A1 | 4/2019 | Tang et al. |
| 2019/0164985 | A1 | 5/2019 | Lee et al. |
| 2021/0013226 | A1 | 1/2021 | Tang et al. |

\* cited by examiner

MULTIPLEXOR FOR A SEMICONDUCTOR DEVICE

TECHNICAL FIELD

The present disclosure relates generally to memory devices, and more particularly, to a multiplexor for a semiconductor device.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain region separated by a channel and body region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a sense line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1:
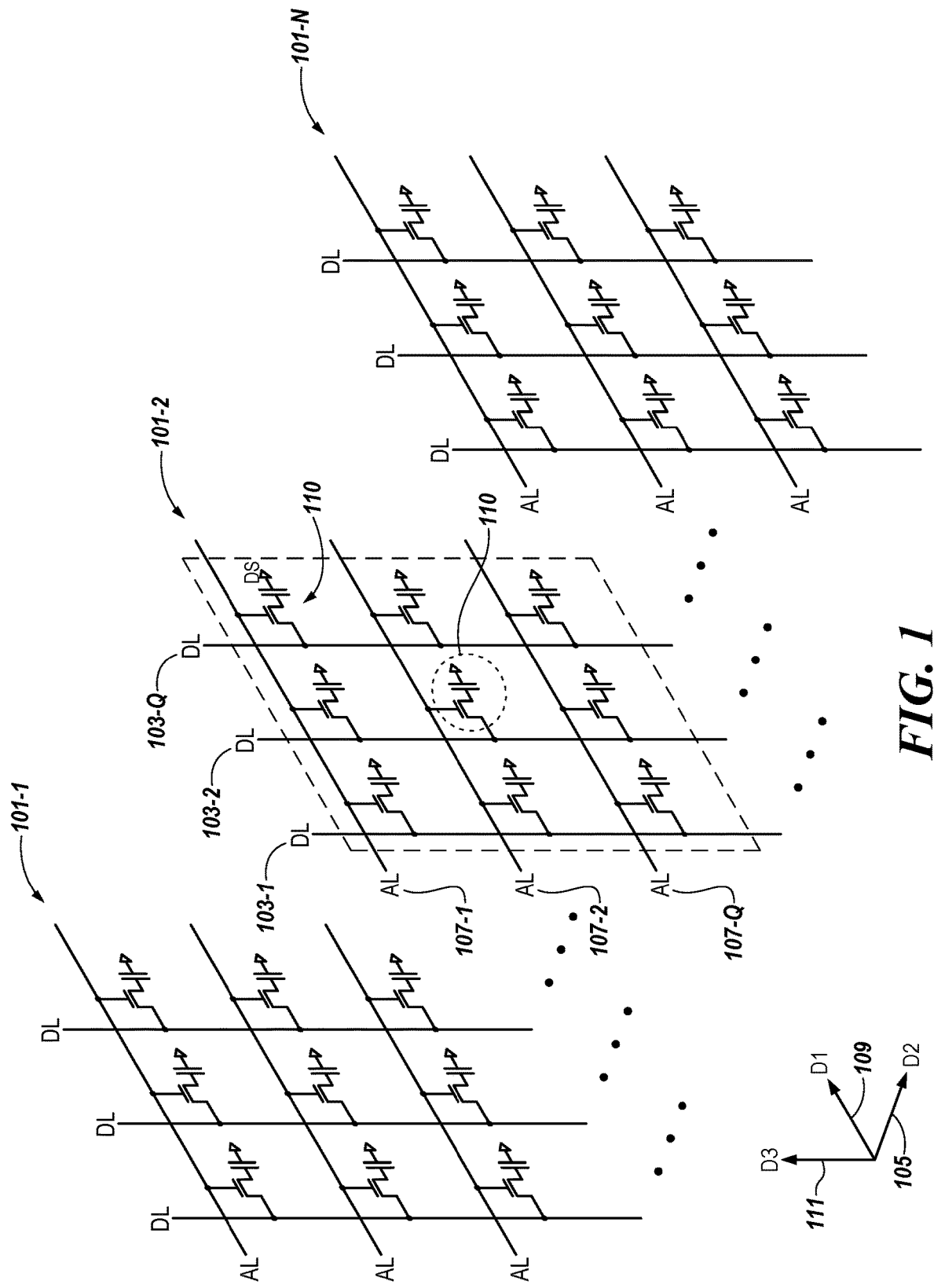
FIG. 1 is a schematic illustration of a vertical three-dimensional (3D) memory, in accordance a number of embodiments of the present disclosure.

Embodiments of the present disclosure describe a multiplexor for semiconductor devices. A multiplexor is integrated into a bottom portion of an array of vertically stacked memory cells. The array can include horizontal access devices, vertical sense lines, and horizontal access lines. Building the multiplexor into the vertical stack instead of building the multiplexor into a substrate material below the vertical stack increases the amount of available space under the bottom of the vertical stack and in the substrate material. The increased amount of available space may allow for additional circuitry, such as semiconductor under the array (SuA) circuitry to be formed under the vertical stack.

The figures herein follow a numbering convention in which the first digit or digits correspond to the figure number of the drawing and the remaining digits identify an element or component in the drawing. Similar elements or components between different figures may be identified by the use of similar digits. For example, reference numeral 230 may reference element "30" in FIG. 2, and a similar element may be referenced as 330 in FIG. 3A. Analogous elements within one figure may be referenced with a reference numeral followed by a hyphen and another numeral or a letter. For example, 203-1 may reference element 203-1 in FIGS. 2 and 203-2 may reference element 203-2, which may be analogous to element 203-1. Such analogous elements may be generally referenced without the hyphen and extra numeral or letter. For example, elements 203-1, 203-2, and 203-Q or other analogous elements may be generally referenced as 203.

FIG. 1 is a schematic illustration of a vertical three-dimensional (3D) memory in accordance a number of embodiments of the present disclosure. FIG. 1 illustrates a cell array that may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of sense lines 103-1, 103-2, . . . , 103-Q (which also may be referred to as bit lines, data lines, or digit lines). In FIG. 1, the access lines 107-1, 107-2, . . . , 107-Q are illustrated extending in a first direction (D1) 109 and the sense lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the sense lines 103-1, 103-2, . . . , 103-Q are extending in a vertical direction, e.g., third direction (D3) 111.

A memory cell (e.g., 110) may include an access device (e.g., access transistor) and a storage node located at an intersection of each access line 107-1, 107-2, ..., 107-Q and each sense line 103-1, 103-2, ..., 103-Q. Memory cells may be written to, or read from, using the access lines 107-1, 107-2, ..., 107-Q and sense lines 103-1, 103-2, ..., 103-Q. The access lines 107-1, 107-2, ..., 107-Q may conductively interconnect memory cells along horizontal rows of each sub cell array 101-, 101-2, ..., 101-N, and the sense lines 103-1, 103-2, ..., 103-Q may conductively interconnect memory cells along vertical columns of each sub cell array 101-, 101-2, ..., 101-N. One memory cell (e.g., 110) may be located between one access line (e.g., 107-2) and one sense line (e.g., 103-2). Each memory cell may be uniquely addressed through a combination of an access line 107-1, 107-2, ..., 107-Q and a sense line 103-1, 103-2, ..., 103-Q.

The access lines 107-1, 107-2, ..., 107-Q may be or include conducting patterns (e.g., metal lines) disposed on and spaced apart from a substrate. The access lines 107-1, 107-2, ..., 107-Q may extend in a first direction (D1) 109. The access lines 107-1, 107-2, .. 107-Q in one sub cell array, e.g., 101-2, may be spaced apart from each other in a vertical direction, e.g., in a third direction (D3) 111.

The sense lines 103-1, 103-2, ..., 103-Q may be or include conductive patterns (e.g., metal lines) extending in a vertical direction with respect to the substrate (e.g., in a third direction (D3) 111). The sense lines in one sub cell array (e.g., 101-2) may be spaced apart from each other in the first direction (D1) 109.

A gate of a memory cell (e.g., memory cell 110) may be connected to an access line (e.g., 107-2) and a first conductive node (e.g., first source/drain region) of an access device (e.g., transistor) of the memory cell 110 may be connected to a sense line (e.g., 103-2). Each of the memory cells (e.g., memory cell 110) may be connected to a storage node (e.g., capacitor). A second conductive node (e.g., second source/drain region), of the access device (e.g., transistor) of the memory cell 110 may be connected to the storage node (e.g., capacitor). While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a sense line (e.g., 103-2), and the other may be connected to a storage node.

Figure 2:
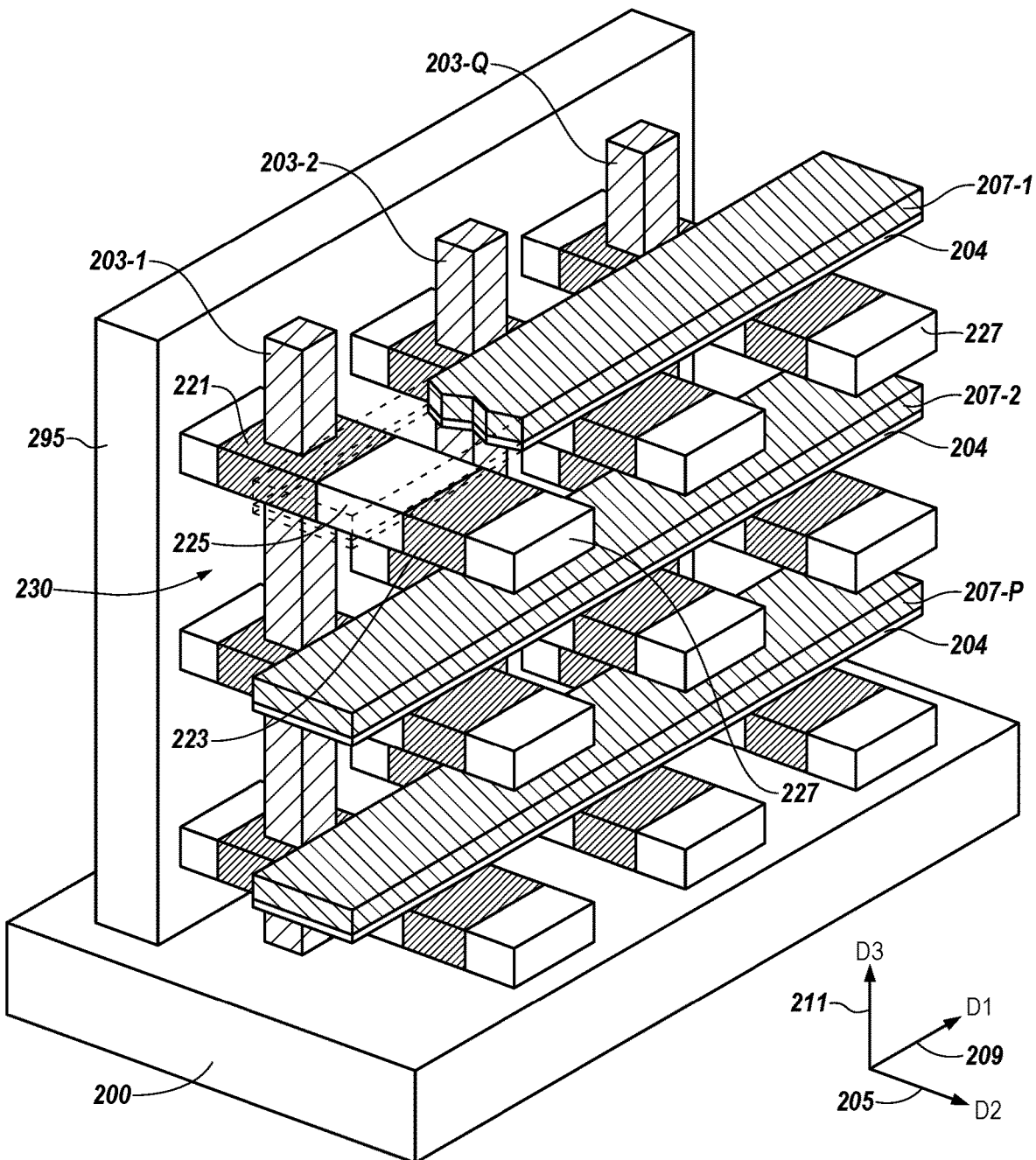
FIG. 2 is a perspective view showing a three-dimensional (3D) semiconductor memory device as a vertically oriented stack of memory cells in an array, in accordance with a number of embodiments of the present disclosure.

FIG. 2 illustrates a perspective view showing a three-dimensional (3D) semiconductor memory device (e.g., a portion of a sub cell array 101-2 shown in FIG. 1) as a vertically oriented stack of memory cells in an array, according to some embodiments of the present disclosure. As shown in FIG. 2, a substrate 200 may have formed thereon one of the plurality of sub cell arrays (e.g., sub cell array 101-2 described in connection with FIG. 1). For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells (e.g., memory cell 110 in FIG. 1) extending in a vertical direction (e.g., third direction (D3) 211). According to some embodiments the vertically oriented stack of memory cells may be fabricated such that each memory cell (e.g., memory cell 110 in FIG. 1) is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1. Each of the repeating, vertical levels, L1, L2, and L3 may include a plurality of discrete components, e.g., regions, to the horizontally oriented access devices 230, e.g., transistors, and storage nodes, e.g., capacitors, including access line 207-1, 207-2, ..., 207-Q connections and sense line 203-1, 203-2, ..., 203-Q connections. The plurality of discrete components to the horizontally oriented access devices 230, e.g., transistors, may be formed in a plurality of iterations of vertically, repeating layers within each level, as described in more detail below in connection with FIGS. 4A-4K, and may extend horizontally in the second direction (D2) 205, analogous to second direction (D2) 105 shown in FIG. 1.

The plurality of discrete components to the laterally oriented access devices 230, e.g., transistors, may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device 230. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a memory cell may similarly extend in the second direction (D2) 205, analogous to second direction (D2) 105 shown in FIG. 1.

As shown in FIG. 2 a plurality of horizontal access lines 207-1, 207-2, ..., 207-Q extend in the first direction (D1) 209, analogous to the first direction (D1) 109 in FIG. 1. The plurality of horizontal access lines 207-1, 207-2, ..., 207-Q may be analogous to the access lines 107-1, 107-2, ..., 107-Q shown in FIG. 1. The plurality of horizontal access lines 207-1, 207-2, ..., 207-Q may be arranged (e.g., "stacked") along the third direction (D3) 211. The plurality of horizontal access lines 207-1, 207-2, ..., 207-Q may include a conductive material. For example, the conductive material may include one or more of a doped semiconductor (e.g., doped silicon, doped germanium, etc.), a conductive metal nitride (e.g., titanium nitride, tantalum nitride, etc.), a metal (e.g., tungsten (W), titanium (Ti), tantalum (Ta), ruthenium (Ru), cobalt (Co), molybdenum (Mo), etc.), and/or a metal-semiconductor compound (e.g., tungsten silicide, cobalt silicide, titanium silicide, etc.). Embodiments, however, are not limited to these examples.

Among each of the vertical levels, the horizontally oriented memory cells, e.g., memory cell 110 in FIG. 1, may be spaced apart from one another horizontally in the first direction (D1) 209. However, the plurality of discrete components to the horizontally oriented access devices 230 (e.g., first source/drain region 221 and second source/drain region 223 separated by a channel region 225) extending laterally in the second direction (D2) 205, and the plurality of horizontal access lines 207-1, 207-2, . . . , 207-Q extending laterally in the first direction (D1) 209, may be formed within different vertical layers within each level. For example, the plurality of horizontal access lines 207-1, 207-2, . . . , 207-Q, extending in the first direction (D1) 209, may be formed on a top surface opposing and electrically coupled to the channel regions 225, separated therefrom by a gate dielectric 204, and orthogonal to horizontally oriented access devices 230 (e.g., transistors) extending in laterally in the second direction (D2) 205. In some embodiments, the plurality of horizontal access lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the horizontally oriented access device are formed.

As shown in the example embodiment of FIG. 2, the sense lines, 203-1, 203-2, . . . , 203-Q, extend in a vertical direction with respect to the substrate 200 (e.g., in a third direction (D3) 211). Further, as shown in FIG. 2, the sense lines, 203-1, 203-2, . . . , 203-Q, in one sub cell array (e.g., sub cell array 101-2 in FIG. 1) may be spaced apart from each other in the first direction (D1) 209. The sense lines, 203-1, 203-2, . . . , 203-Q, may be provided, extending vertically relative to the substrate 200 in the third direction (D3) 211 in vertical alignment with source/drain regions to serve as first source/drain regions 221 or, as shown, be vertically adjacent first source/drain regions 221 for each of the horizontally oriented access devices 230 (e.g., transistors) extending laterally in the second direction (D2) 205, but adjacent to each other on a level (e.g., first level (L1)) in the first direction (D1) 209. Each of the sense lines, 203-1, 203-2, . . . , 203-Q, may vertically extend, in the third direction (D3), on sidewalls, adjacent first source/drain regions 221, of respective ones of the plurality of horizontally oriented access devices 230 (e.g., transistors) that are vertically stacked. In some embodiments, the plurality of vertical sense lines 203-1, 203-2, . . . , 203-Q, extending in the third direction (D3) 211, may be connected to side surfaces of the first source/drain regions 221 directly and/or through additional contacts including metal silicides.

For example, and as shown in more detail in FIG. 2, a first one of the vertically extending sense lines (e.g., 203-1) may be adjacent a sidewall of a first source/drain region 221 to a first one of the horizontally oriented access devices 230 (e.g., transistors) in the first level, a sidewall of a first source/drain region 221 of a first one of the horizontally oriented access devices 230 (e.g., transistors) in the second level, and a sidewall of a first source/drain region 221 a first one of the horizontally oriented access devices 230 (e.g., transistors) in the third level, etc. Similarly, a second one of the vertically extending sense lines (e.g., 203-2) may be adjacent a sidewall to a first source/drain region 221 of a second one of the horizontally oriented access devices 230 (e.g., transistors) in the first level, spaced apart from the first one of horizontally oriented access devices 230 (e.g., transistors) in the first level in the first direction (D1) 209. And the second one of the vertically extending sense lines (e.g., 203-2) may be adjacent a sidewall of a first source/drain region 221 of a second one of the laterally oriented access devices 230 (e.g., transistors) in the second level, and a sidewall of a first source/drain region 221 of a second one of the horizontally oriented access devices 230 (e.g., transistors) in the third level, etc. Embodiments are not limited to a particular number of levels.

The vertically extending sense lines, 203-1, 203-2, . . . , 203-Q, may include a conductive material, such as, for example, one of a doped semiconductor material, a conductive metal nitride, metal, and/or a metal-semiconductor compound. The sense lines, 203-1, 203-2, . . . , 203-Q, may correspond to sense lines described in connection with FIG. 1.

As shown in the example embodiment of FIG. 2, a conductive body contact 295 may be formed extending in the first direction (D1) 209 along an end surface of the horizontally oriented access devices 230 (e.g., transistors) in each level above the substrate 200. The body contact 295 may be connected to a body (e.g., body region) of the horizontally oriented access devices 230 (e.g., transistors) in each memory cell (e.g., memory cell 110 in FIG. 1). The body contact 295 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 3A:
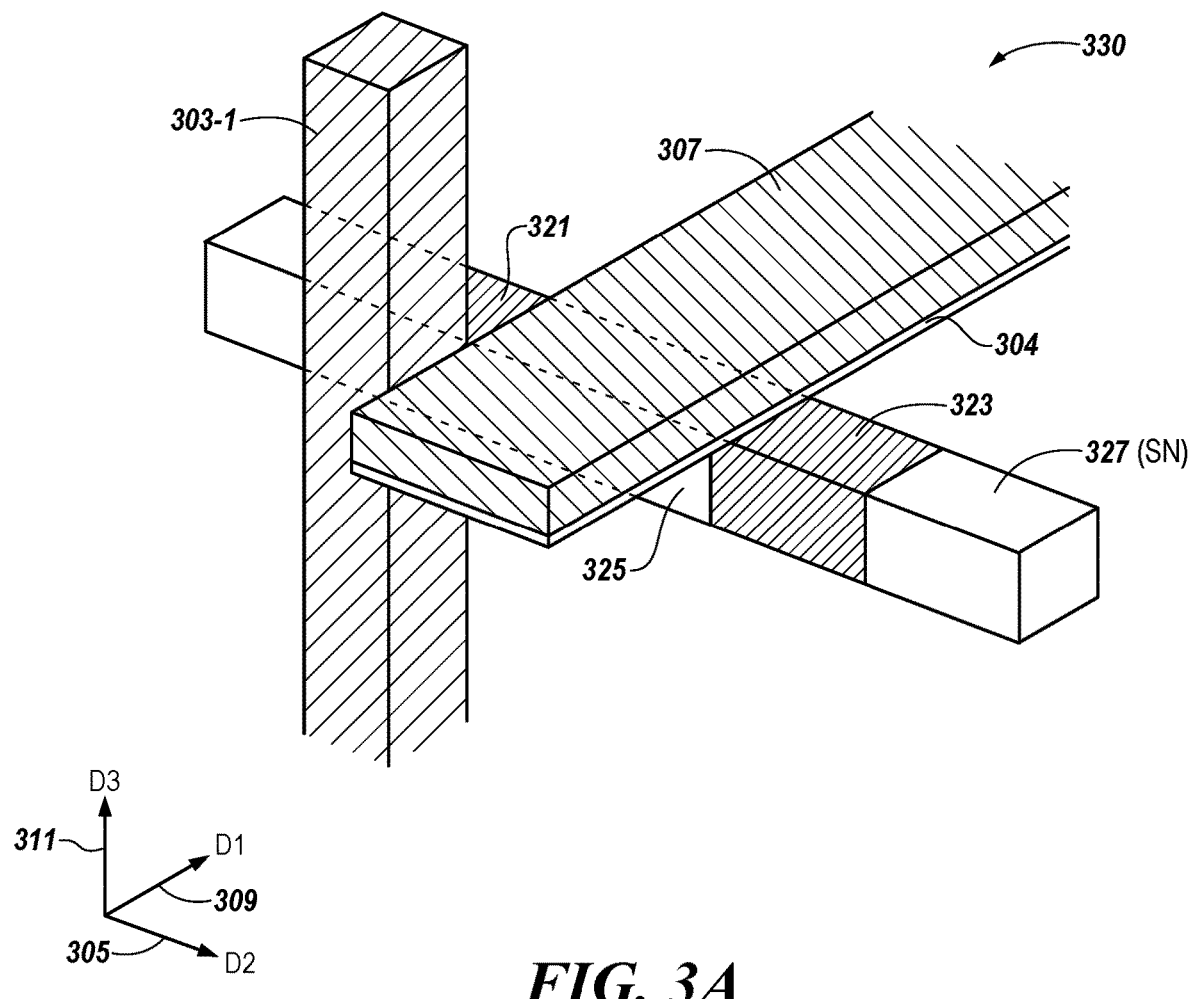
FIGS. 3A-3B are perspective views illustrating a channel and body region of a three-node access device for semiconductor devices, in accordance with a number of embodiments of the present disclosure.

FIG. 3A illustrates in more detail a memory cell of the vertically stacked array of memory cells (e.g., within a sub cell array 101-2 in FIG. 1) according to some embodiments of the present disclosure. As shown in FIG. 3A, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2. The first and the second source/drain regions, 321 and 323, may be separated by a channel 325 formed in a body of semiconductor material (e.g., body region) of the horizontally oriented access devices 330 (e.g., transistors). The first and the second source/drain regions, 321 and 323, may be formed from an n-type or p-type dopant doped in the body region. A storage node 327 may be coupled to the second source/drain region 323. Embodiments are not so limited. A first direction (D1) 309, a second direction (D2) 305, and a third direction (D3) 311 are analogous to the first direction (D1) 209, the second direction (D2) 205, and the third direction (D3) 211 of FIG. 2, respectively.

For example, for an n-type conductivity transistor construction, the body region of the laterally oriented access devices 330 (e.g., transistors) may be formed of a low doped p-type (p-) semiconductor material. In one embodiment, the body region and the channel 325 separating the first and the second source/drain regions, 321 and 323, may include a low doped, p-type (e.g., low dopant concentration (p-)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants (e.g., phosphorus (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the horizontally oriented access devices 330 (e.g., transistors) may be of a p-type conductivity construction in which case the impurity (e.g., dopant) conductivity types would be reversed.

As shown in the example embodiment of FIG. 3A, the first source/drain region 321 may occupy an upper portion in the body of the laterally oriented access devices 330 (e.g., transistors). For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in electrical contact with the body contact. Further, as shown in the example embodiment of FIG. 3A, an access line (e.g., 307) analogous to the access lines 207-1, 207-2, . . . , 207-Q in FIGS. 2 and 107-1, 107-2, . . . , 107-Q shown in FIG. 1, may disposed on a top surface opposing and coupled to a channel region 325, separated therefrom by a gate dielectric 304. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 3A, a sense line (e.g., 303-1) analogous to the sense lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330 (e.g., transistors) horizontally conducting between the first and the second source/drain regions 321 and 323 along the second direction (D2) 305. In this embodiment, the vertical sense line 303-1 is formed asymmetrically adjacent in electrical contact with the first source/drain regions 321. The sense line 303-1 may be formed as asymmetrically to reserve room for a body contact in the channel region 325.

Figure 3B:
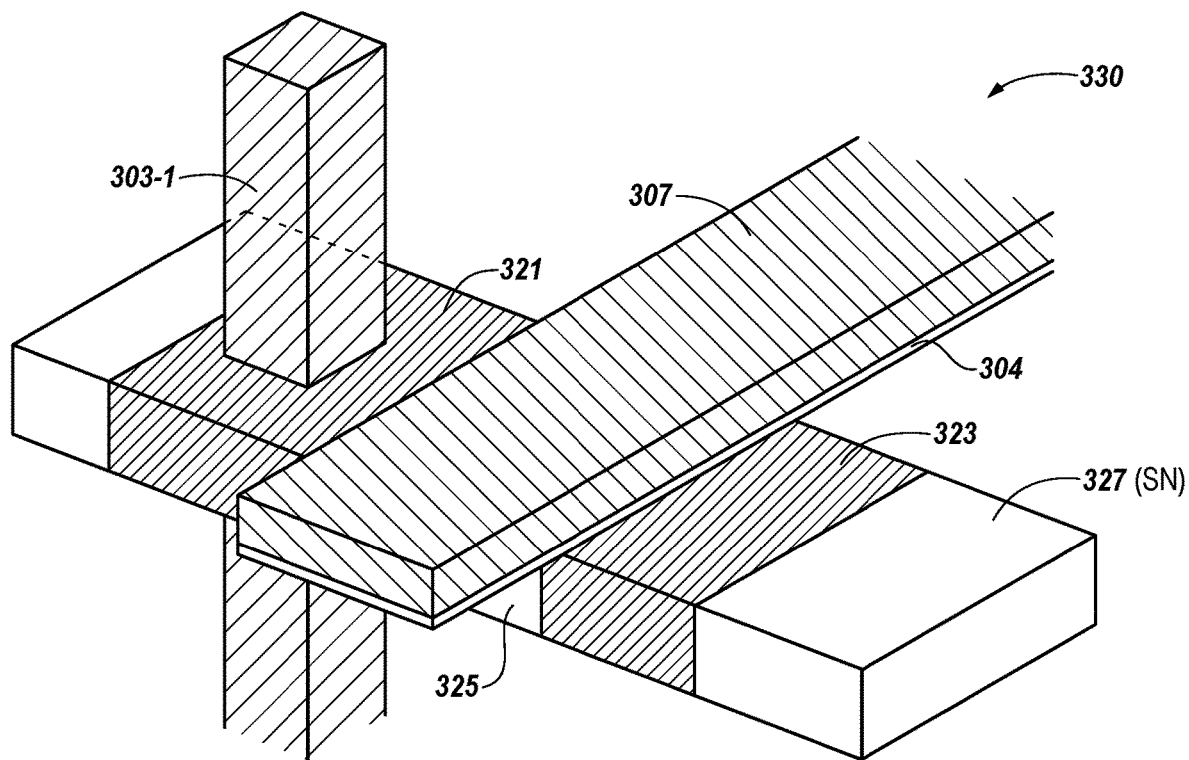

FIG. 3B illustrates in more detail a memory cell of the vertically stacked array of memory cells (e.g., within a sub cell array 101-2 in FIG. 1) according to some embodiments of the present disclosure. As shown in FIG. 3B, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2 and the first and the second source/drain regions 321 and 323 shown in FIG. 3A. The first and the second source/drain regions may be separated by a channel 325 formed in a body of semiconductor material, e.g., body region, of the horizontally oriented access devices 330 (e.g., transistors). The first and the second source/drain regions, 321 and 323, may be formed from an n-type or p-type dopant doped in the body region. Embodiments are not so limited. A first direction (D1) 309, a second direction (D2) 305, and a third direction (D3) 311 are analogous to the first direction (D1) 209, the second direction (D2) 205, and the third direction (D3) 211 of FIG. 2, respectively.

As shown in the example embodiment of FIG. 3B, a sense line (e.g., 303-1) analogous to the sense lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330 (e.g., transistors) horizontally conducting between the first and the second source/drain regions 321 and 323 along the second direction (D2) 305. In this embodiment, the vertical sense line 303-1 is formed symmetrically, in vertical alignment, in electrical contact with the first source/drain region 321. The sense line 303-1 may be formed in contact with an insulator material such that there is no body contact within channel 325.

As shown in the example embodiment of FIG. 3B, the sense line 303-1 may be formed symmetrically within the first source/drain region 321 such that the first source/drain region 321 surrounds the sense line 303-1 all around. The first source/drain region 321 may occupy an upper portion in the body of the laterally oriented access devices 330 (e.g., transistors). For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in contact with the body contact. An insulator material may fill the body contact such that the first source/drain region 321 may not be in electrical contact with channel 325. Further, as shown in the example embodiment of FIG. 3B, an access line (e.g., 307-1) analogous to the access lines 207-1, 207-2, . . . , 207-Q in FIGS. 2 and 107-1, 107-2, . . . , 107-Q shown in FIG. 1, may disposed on a top surface opposing and coupled to a channel region 325, separated therefrom by a gate dielectric 304. A storage node 327 may be coupled to the second source/drain region 323.

Figure 3B:
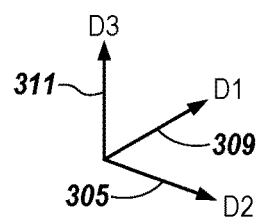
Figure 4:
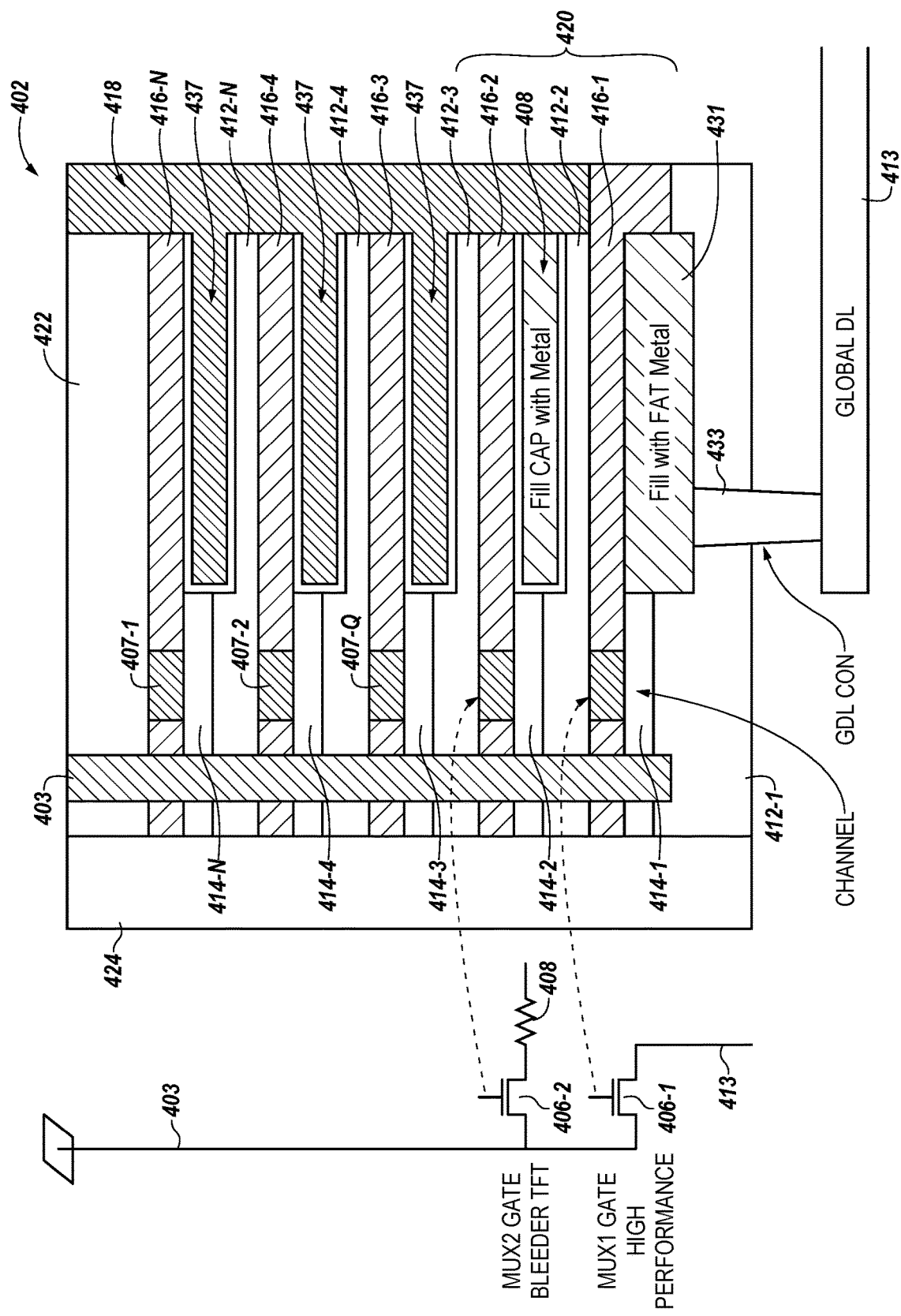
FIG. 4 is a cross-sectional view of a multiplexor for a semiconductor device, in accordance with a number of embodiments of the present disclosure.

FIG. 4 is a cross-sectional view of a multiplexor for a semiconductor device, in accordance with a number of embodiments of the present disclosure. As shown in FIG. 4, the vertical stack 402 can include repeating, alternating layers of a first dielectric material 412-1, 412-2, 412-3, 412-4, . . . , 412-N, a semiconductor material 414-1, 414-2, 414-3, 414-4, . . . , 414-N, and a second dielectric material 416-1, 416-2, 416-3, 416-4, . . . , 416-N. In some embodiments, at least two (2) repeating iterations of the alternating layers may be formed to form the vertical stack 402 to a height in a range of twenty (20) nanometers (nm) to three hundred (300) nm. The layers of semiconductor material 414 can also be referred to as channels 414. In some embodiments, the first dielectric material 412, the semiconductor material 414, and the second dielectric material 416 may be formed using a chemical vapor deposition (CVD) process. In one embodiment, the first dielectric material 412 can be deposited to have a thickness (e.g., vertical height) in the third direction (D3), in a range of 20 nm to sixty (60) nm. In one embodiment, the semiconductor material 414 can be deposited to have a thickness (e.g., vertical height) in a range of ten (10) nm to thirty (30) nm. In one embodiment, the second dielectric material 416 can be deposited to have a thickness (e.g., vertical height), in a range of 20 nm to one hundred and fifty (150) nm. Embodiments, however, are not limited to these examples. As shown in FIG. 4, a vertical direction 411 is illustrated as a third direction (D3) (e.g., z-direction in an x-y-z coordinate system) analogous to the third direction (D3) among first, second, and third directions, shown in FIGS. 1-3. The vertical stack 402 can also include a dielectric cap 422.

In some embodiments, the first dielectric material 412 may be an interlayer dielectric (ILD). By way of example, and not by way of limitation, the first dielectric material 412 may comprise an oxide material, e.g., $SiO_2$. In another example the first dielectric material 412 may comprise a silicon nitride ($Si_3N_4$) material (also referred to herein as "SiN"). In another example the first dielectric material 412 may comprise a silicon oxy-carbide ($SiO_xC_y$) material. In another example the first dielectric material 412 may include silicon oxy-nitride ($SiO_xN_y$) material (also referred to herein as "SiON"), and/or combinations thereof. Embodiments are not limited to these examples.

In some embodiments, the second dielectric material 416 may be an interlayer dielectric (ILD). By way of example, and not by way of limitation, the second dielectric material 416 may comprise a nitride material. The nitride material may be a silicon nitride ($Si_3N_4$) material. In another example the second dielectric material 416 may comprise a silicon oxy-carbide (SiOC) material. In another example the second dielectric material 416 may include silicon oxy-nitride (SiON), and/or combinations thereof. Embodiments are not limited to these examples. However, according to embodiments, the second dielectric material 416 is purposefully chosen to be different in material or composition than the first dielectric material 412 such that a selective etch process may be performed on one of the first and second dielectric layers, selective to the other one of the first and the second dielectric layers (e.g., the second SiN dielectric material 416 may be selectively etched relative to the semiconductor material 414 and a first oxide dielectric material 412).

In some embodiments the semiconductor material 414 may comprise a silicon (Si) material in a polycrystalline and/or amorphous state. The semiconductor material 414 may be a low doped, p-type (p-) silicon material. The semiconductor material 414 may be formed by gas phase doping boron atoms (B), as an impurity dopant, at a low concentration to form the low doped, p-type (p-) silicon material. In some embodiments, the semiconductor material 416 may be formed by gas phase doping boron atoms (B) in-situ. The low doped, p-type (p-) silicon material may be an amorphous silicon material. Embodiments, however, are not limited to these examples.

The vertical stack 402 can also include a sense line 403 and a plurality of access lines 407-1, 407-2, ..., 407-Q. In some embodiments, the sense line 403 can be a vertical sense line that intersects and makes contact with each of the layers of the vertical stack 402. In some embodiments, the access lines 407 may be horizontal access lines 407 and may be formed in the semiconductor material 416 layers of the vertical stack 402. The vertical stack 402 may also include a dielectric material 424 to isolate multiple vertical stacks 402, horizontally oriented storage nodes 437 (e.g., capacitor cells), and vertical portions of the storage nodes 418-1.

The vertical stack 402 may also include a multiplexor 420. As used herein, the term "multiplexor" refers to circuitry to select one of multiple vertical and/or horizontal sense lines. As shown in FIG. 4, in some embodiments, the multiplexor 420 can be the bottom portion of the vertical stack 402. In some embodiments, the multiplexor 420 can include the first dielectric material 412, the semiconductor material 414, the second dielectric material 416, and the sense line 403 (e.g., local sense line) of the vertical stack 402. However, instead of access lines (e.g., access lines 407), a first multiplexor switch 406-1 and a second multiplexor switch 406-2 are formed in the semiconductor material 416. In some embodiments, the multiplexor switches 406 may be formed in an area of the semiconductor material 416 corresponding to an area of the semiconductor material 416 in which the access lines 407 are formed, such that the multiplexor switches 406 are in a vertical alignment with the access lines 407. The first multiplexor switch 406-1 comprises a first gate and the second multiplexor switch 406-2 comprises a second gate. In some embodiments, the first gate and the second gate run parallel to and vertically in line with a respective horizontal access line 407 in each of the plurality of tiers. As shown in FIG. 4, the multiplexor switches 406 can be below the access lines 407. The first layer of semiconductor material 414-1 can function as a channel for the first multiplexor switch 406-1 and the second layer of the semiconductor material 414-2 can function as a channel for the second multiplexor switch 406-2. Subsequent layers of the semiconductor material (e.g., semiconductor material 414-3, 414-4, ..., 414-N) can function as channels for memory cells (e.g., memory cell 110 in FIG. 1).

The first multiplexor switch 406-1 and the second multiplexor switch 406-2 can be selectively coupled to the same respective vertical sense line (e.g., sense line 403) as the access lines 407 in the vertical stack 402. A first terminal (e.g., source/drain region) of the first multiplexor switch 406-1 can be coupled to the sense line 403 and a second terminal of the first multiplexor switch 406-1 can be coupled to a horizontal (e.g., global) sense line 413. The first multiplexor switch 406-1 can couple to the horizontal sense line 413 through the first metal fill 431 coupled to the second terminal of the first multiplexor switch 406-1 and a metal line (e.g., horizontal sense line contact) 433 that is coupled to the horizontal sense line 413. The area in which the first metal fill 431 is deposited can be filled with "fat" metal (e.g., filled with metal to a thickness greater than that of the second metal fill 408 discussed below). Applying a voltage to the gate of the first multiplexor switch 406-1 may electronically couple the local sense line 403 to the horizontal sense line 413. The first multiplexor gate (mux1 gate) can be configured for high performance.

A first terminal of the second multiplexor switch 406-2 may be coupled to the sense line 403 and a second terminal of the second multiplexor switch can include a second metal fill 408. In some embodiments, the second metal fill 408 may be deposited in a horizontal opening parallel to and substantially similar to the horizontal openings in which the capacitor material is deposited. Due to the thickness at which the second metal fill 408 may be deposited, the second metal fill 408 may function as a resistor and restrict the flow of current through the second terminal of the second multiplexor switch 406-2. The second metal fill 408 can be used to discharge the voltage stored in a capacitor when voltage is no longer being applied to the capacitor. In some embodiments, the second metal fill 408 may be coupled to the capacitor 437. Applying a voltage to a gate of the second multiplexor switch 406-2 may couple the second metal fill 408 to the capacitor 437 to discharge any charge stored in the capacitor 437. Applying a voltage to the gate of the second multiplexor switch 406-2 can also precharge the vertical sense line 403.

In some embodiments, a second terminal of the first multiplexor switch 406-1 can have a first vertical thickness and be coupled to a respective horizontal sense line 413. Further, a second terminal of the second multiplexor switch 406-2 can have a second vertical thickness that is less than the first vertical thickness. The difference in vertical thickness can cause the second terminal of the first multiplexor switch 406-1 to have a higher resistance than the second terminal of the second multiplexor switch 406-2. In some embodiments, the second terminal of the first multiplexor switch 406-1 and the second terminal of the second multiplexor switch 406-2 run parallel to and vertically in line with a plurality of storage nodes in a particular vertical stack of memory cells.

Figure 5:
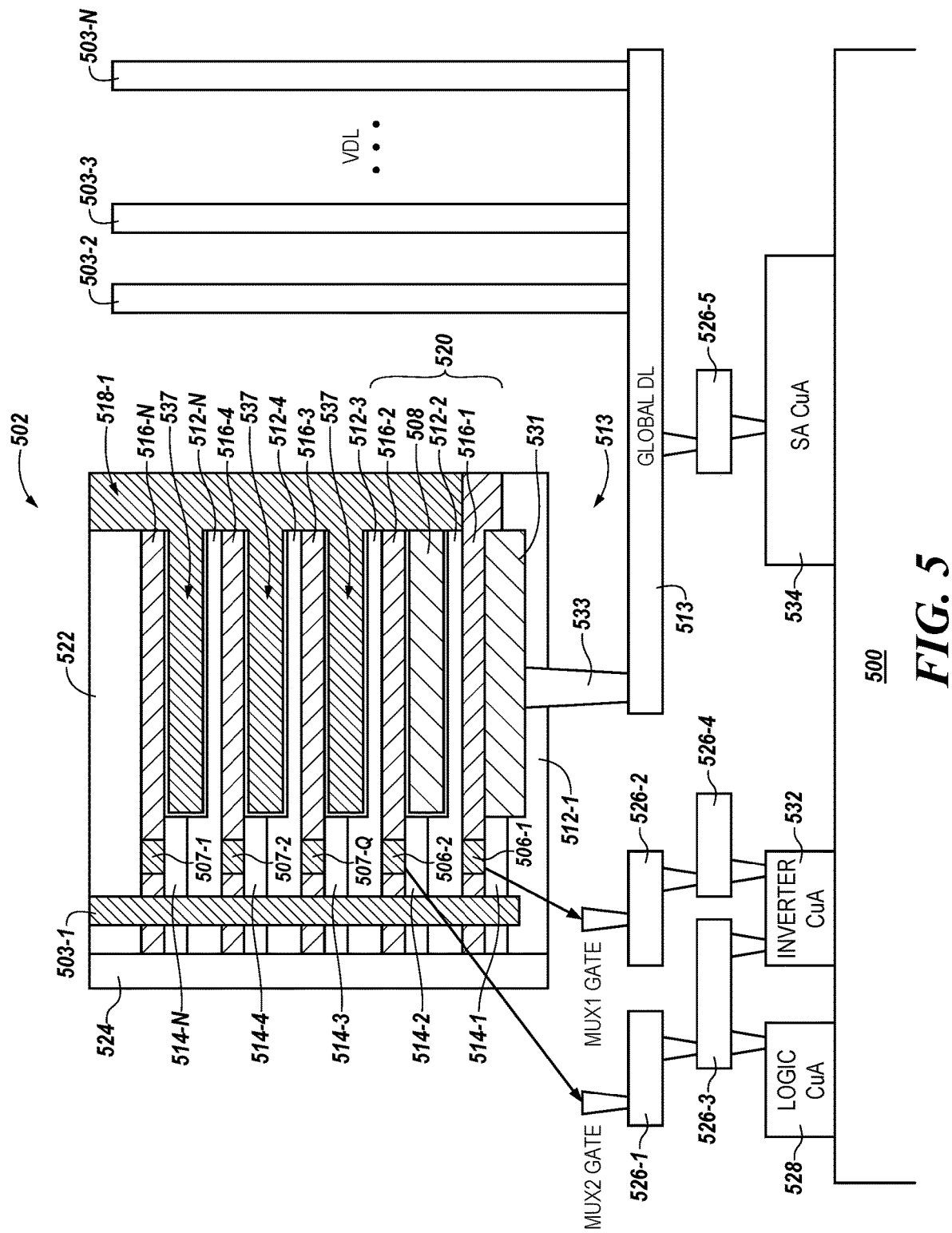
FIG. 5 is another cross-sectional view of a multiplexor for a semiconductor device, in accordance with a number of embodiments of the present disclosure.

FIG. 5 is another cross-sectional view of a multiplexor for a semiconductor device, in accordance with a number of embodiments of the present disclosure. FIG. 5 illustrates one of a plurality of vertical stacks 502 including memory cells. The array of memory cells can comprise a plurality of vertically stacked tiers of memory cells, a respective plurality of horizontal access lines 507-1, 507-2, . . . , 507-Q coupled to each of the plurality of tiers, and a vertical sense line 503 coupled to plurality of tiers. The vertical sense line 503-1 may be one of a plurality of vertical sense lines (503-1, 503-2, 503-3, . . . , 503-N) coupled to each of the plurality of tiers. The vertical stack 502 illustrated in FIG. 5 is analogous to the vertical stack 402 illustrated in FIG. 4. The first direction (D1) 509, the second direction (D2) 505, and the third direction (D3) 511 are analogous to the first direction (D1) 209, the second direction (D2) 205, and the third direction (D3) 211 of FIG. 2, respectively.

The array of memory cells can comprise a plurality of multiplexors each coupled to a respective vertical sense line 503 and configured to electrically couple the respective vertical sense line 503 to a horizontal sense line 513. FIG. 5 illustrates one multiplexor (e.g., multiplexor portion) 520 of the plurality multiplexors coupled to a vertical sense line 503-1. The multiplexor 520 is analogous to the multiplexor 420 illustrated in FIG. 4. Although not specifically illustrated in FIG. 5, a respective multiplexor analogous to the multiplexor 520 is coupled to each of the vertical sense lines 503-2, 503-3, . . . , 503-N. Each multiplexor 520 can be coupled between the plurality of vertically stacked tiers and the respective horizontal sense line 513 via the respective vertical sense line 503-1, and the respective horizontal sense line 513 is coupled to a particular sense amp (e.g., sense amp semiconductor under the array (SuA) circuitry) 534. The SuA circuitry can also be referred to as CuA circuitry.

The SuA circuitry can include control (e.g., logic) circuitry 528 coupled to the plurality of multiplexors and configured to cause the respective multiplexor 520 to electrically couple the respective vertical sense line 503-1 to the respective horizontal sense line 513. The first multiplexor switch 506-1 may be coupled to inverter circuitry 532 through conductive lines 526-2 and 526-4 and the second multiplexor switch 506-2 may be coupled to logic circuitry 528 and the inverter circuitry 532 through the conductive lines 526-1 and 526-3. The reference numerals 506-1 and 506-2 point to the gates of the multiplexor switches, but for simplicity, the term switch is used. As used herein, the term "logic circuitry" refers to a circuit that comprises a plurality of logic gates, such as NOT AND (NAND) logic gates and NOT OR (NOR) logic gates, among other examples. As used herein, the term "inverter circuitry" refers to circuitry that converts one type of signal to a different type of signal. For example, inverter circuitry 532 can convert a high (e.g., logic level 1) voltage to a low (e.g., logic level 0) voltage and/or convert a low voltage to a high voltage. In some embodiments, the logic circuitry 528 and the inverter circuitry 532 may be SuA circuitry that is built below the vertical stack 502 and the multiplexor 520. Further, the logic circuitry 528 and the inverter circuitry 532 may be built on a substrate material 500.

In some embodiments, the logic circuitry 528 may be coupled to a gate of the second multiplexor switch 506-2 and the inverter circuitry 532 may be coupled to a gate of the first multiplexor switch 506-1. The logic circuitry 528 and the inverter circuitry 532 function to control the gates of the first multiplexor switch 506-1 and the second multiplexor switch 506-2 to turn the first multiplexor switch 506-1 and the second multiplexor switch 506-2 on or off as desired.

The array of memory cells can also comprise semiconductor under the array (SuA) circuitry, comprising a plurality of sense amplifiers (sense amps), each sense amp 534 coupled to a respective subset of the plurality of multiplexors. As shown in FIG. 5, sense amp 534 may be coupled to the horizontal sense line 513 through a conductive line 526-5. As used herein, the term "sense amp" refers to memory component configured to sense low power signals from a sense line that represents a data bit (e.g., a data bit with a value of "1" or "0") stored in a memory cell and amplify the small voltage swing to recognizable levels so the data can be interpreted properly by logic circuitry. In some embodiments, the sense amp 534 may be SuA circuitry that is formed on a substrate material that is below the vertical stack 502 and the multiplexor 520.

The sense amp 534 may be SuA circuitry because the multiplexor 520 is formed to be under the vertical stack 502 on a substrate material 500. The multiplexor 520, in contrast, is formed as a portion of the vertical stack 502, (e.g., rather than being formed on the substrate material 500. Forming the multiplexor 520 as a portion of the vertical stack 502 instead of on the substrate material 500 below the vertical stack 502 results in more space being available on the substrate material 500 under the vertical stack 502 for other memory components to be built. In embodiments described herein, forming the multiplexor 520 as a portion of the vertical stack 502 opens up enough space for the sense amp 534 to be built on the substrate material 500 below the vertical stack 502 instead of being formed on another portion of the substrate material 500.

A memory device in which the vertical stack 502 is incorporated may be operated by activating the vertical sense line 503-1 coupled to the vertical stack 502 of the memory device. The first multiplexor switch 506-1 and the second multiplexor switch 506-2 can be activated by applying a respective activation voltage to either the first multiplexor switch 506-1 or the second multiplexor switch 506-2. In some embodiments, the second multiplexor switch 506-2 of a multiplexor portion 520 of the vertical stack 502 is activated to drain a charge from a horizontal portion of storage node 537, wherein a first terminal of the second multiplexor switch 506-2 is coupled to the vertical sense line 503-1 and a second terminal of the second multiplexor switch 506-2 is coupled to a vertical portion of a storage node 518-1 of the vertical stack 502. Activating the second multiplexor switch 506-2 can result in draining a charge from the vertical portion of the storage node 518-1. In some embodiments, the first multiplexor switch 506-1 of the multiplexor portion 520 of the vertical stack 502 is activated to select the vertical sense line 503-1, wherein the first terminal of the first multiplexor switch 506-1 is coupled to the vertical sense line 503-1 and a second terminal of the first multiplexor switch 506-1 is coupled to the horizontal sense line 513. Selecting the vertical sense line 503-1 allows a memory cell and a horizontal access line 507 coupled to the vertical sense line to be sensed. In some embodiments, the horizontal sense line 513 coupled to the first multiplexor switch 506-1 can be operated with a greater voltage and/or current than that of the vertical sense line 503-1 coupled to the first multiplexor switch 506-1 and the second multiplexor switch 506-2.

Figure 6:
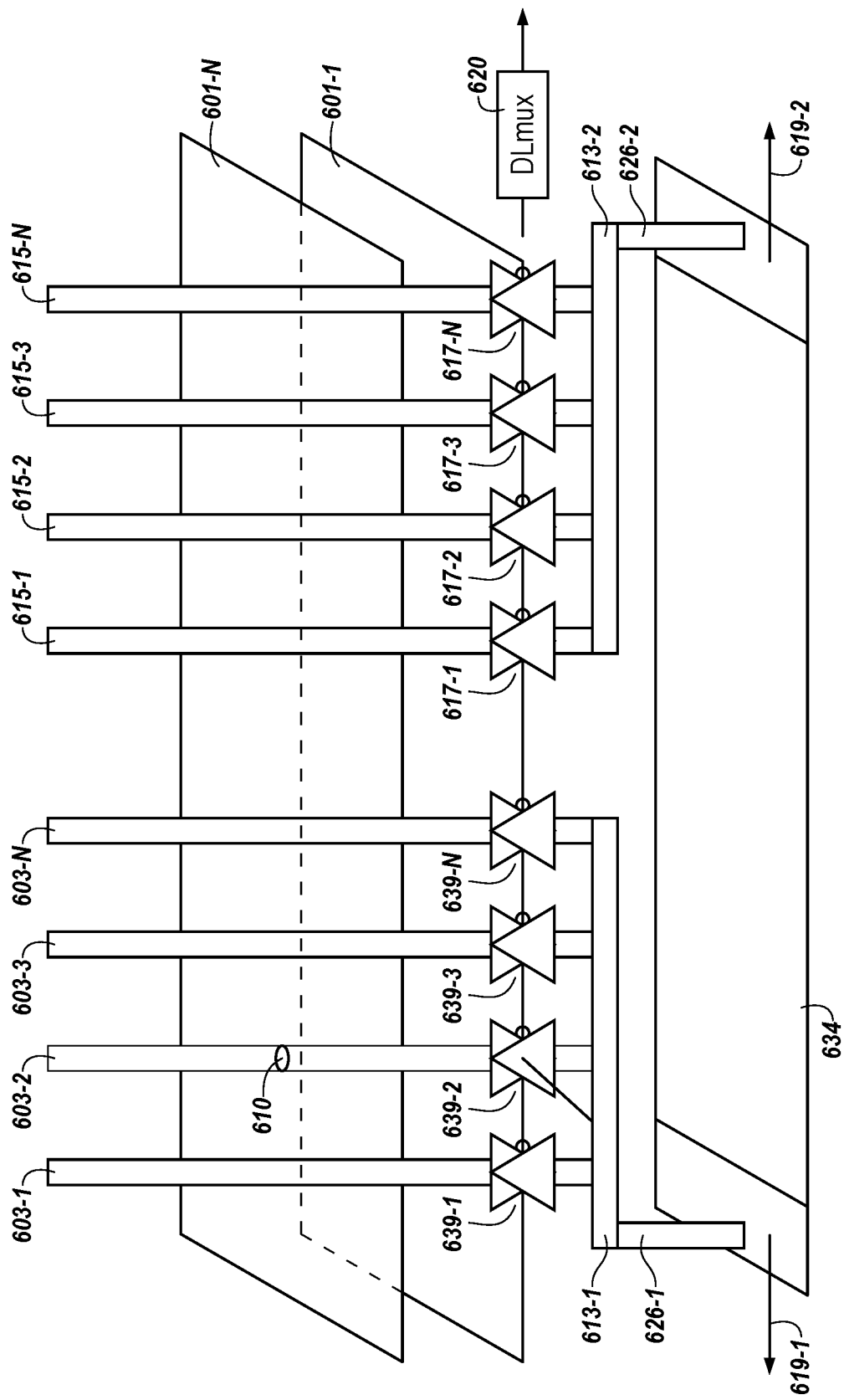
FIG. 6 is a perspective schematic view of a multiplexor for a semiconductor device, in accordance with a number of embodiments of the present disclosure.

FIG. 6 is a perspective view of a multiplexor for a semiconductor device, in accordance with a number of embodiments of the present disclosure. The semiconductor device can include vertically stacked tiers of memory cells 642-1, ..., 642-N, vertical sense lines (e.g., local sense lines) 603-1, 603-2, 603-3, ..., 603-N, and horizontal sense lines (e.g., global sense lines) 613-1, 613-2, 613-3, ..., 613-N. In some embodiments that use differential sensing, the semiconductor device can include reference sense lines 615-1, 615-2, 615-3, 615-N. The local sense lines 603 may be coupled to a first horizontal sense line 613-1, which may be referred to as a "true" horizontal sense line, through multiplexor switches 639-1, 639-2, 639-3, ..., 639-N. The reference sense lines 615 may be coupled to a second horizontal sense line 613-2, which may be referred to as a "bar" horizontal sense line, through multiplexor switches 617-1, 617-2, 617-3, ..., 617-N. Further, the first horizontal sense line 613-1 and the second horizontal sense line 613-2 may be coupled to a sense amp 634 through conductive lines 626-5 (both lines labeled 626-5). The first direction (D1) 609, the second direction (D2) 605, and the third direction (D3) 611 are analogous to the first direction (D1) 209, the second direction (D2) 205, and the third direction (D3) 211 of FIG. 2 respectively As shown in FIG. 6, the sense amp 634 can be SuA circuitry built under the horizontal sense lines 613. The sense amp 634 may have a length in the x-direction in a range of five (5) micrometers (μm) to eight (8) μm and a length in the y-direction in a range of five hundredths (0.05) of a μm to one (1) μm. In some embodiments, the sense amp 634 may have a length in the x-direction of six and four tenths (6.4) μm and a length in the y-direction of seven hundredths (0.07) of a μm. In some embodiments, the sense amp 634 may include column select circuitry to control the multiplexors 615 to select between the sense lines 603 coupled to the first horizontal sense line and the horizontal sense lines 613 coupled to the second horizontal sense line 613-2. In some embodiments, the sense amp 634 can also include input/output (I/O) circuitry 619-1 and 619-2 to communicate with other memory components.

As an example, and as shown in FIG. 6, a particular vertical sense line 603-2 can be activated. As used herein, the term "activated" refers to conductively coupling the vertical sense line 603-2 to the horizontal sense line 613-1 and/or coupling the reference sense line 615-2 to the reference horizontal sense line 613-2. Activating the vertical sense line 603-2 may allow data to be transferred to a memory cell 610 of the arrays of memory cells that are coupled to the sense line 603-2. Activating the sense line 603-2 can be achieved by activating the multiplexor switch 639-2 coupled to the sense line 603-2. Activating the multiplexor 639-2 can couple the sense line 603-2 to the horizontal sense line 613-1. Activating the reference sense line 615-2 can be achieved by activating the multiplexor 617-2 coupled to the sense line 615-2. Activating the multiplexor 617-2 can couple the reference sense line 615-2 to the horizontal sense line 613-2. In some embodiments, activating multiplexor 639-2 can activate the multiplexor 617-2.

Figure 7A:
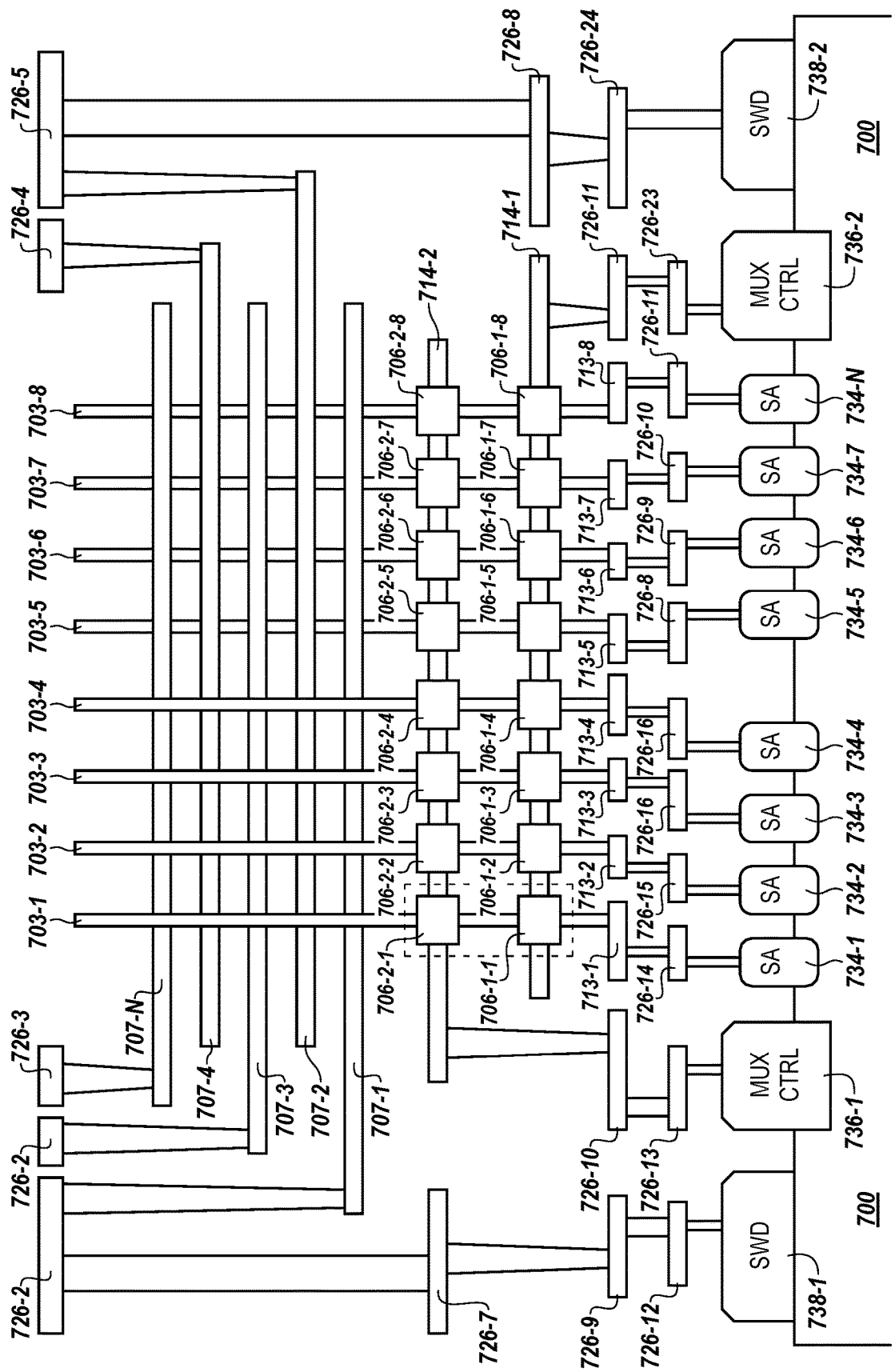
FIG. 7A is a block diagram of a multiplexor for a semiconductor device, in accordance with a number of embodiments of the present disclosure.

FIG. 7A is a block diagram illustrating a multiplexor for a semiconductor device, in accordance with a number of embodiments of the present disclosure. As shown in FIG. 7A, a memory device includes a plurality of vertical sense lines (e.g., local sense lines) 703-1, 703-2, 703-3, ..., 703-8, horizontal access lines 707-1, 707-2, 707-3, 707-4, ..., 707-N, a first multiplexor gate 714-1, and a second multiplexor gate 714-2. FIG. 7A also shows first horizontal sense lines (e.g., global sense lines) 713-1-1, 713-1-2, 713-1-3, ..., 713-1-N, second horizontal sense lines 713-2-1, 713-2-2, 713-2-3, ..., 713-2-N, and sense amps 734-1, 734-2, ..., 734-N. The first direction (D1) 709, the second direction (D2) 705, and the third direction (D3) 711 are analogous to the first direction (D1) 209, the second direction (D2) 205, and the third direction (D3) 211 of FIG. 2, respectively. FIG. 7A is illustrated at a y/z angle. The x-direction is analogous to the first direction (D1) 709, the y-direction is analogous to the second direction (D2) 705, and the z-direction is analogous to the third direction (D3) 711.

Applying a voltage to a first multiplexor gate 714-1 can activate first multiplexor switches 706-1-1, 706-1-2, 706-1-3, 706-1-4, 706-1-5, 706-1-6, 706-1-7, 706-1-8 (individually or collectively referred to as first multiplexor switches 706-1) and applying a voltage to a second multiplexor gate 714-2 can activate second multiplexor switches 706-2-1, 706-2-2, 706-2-3, 706-2-4, 706-2-5, 706-2-6, 706-2-7, 706-2-8 (individually or collectively referred to as second multiplexor switches 706-2). Activating the second multiplexor switch 706-2 bleeds (e.g., drains) a charge from a capacitor of a respective array of memory cells. The second multiplexor gate (mux2 gate) can be the gate of a second multiplexor switch 406-2. The second multiplexor switch 406-2 can be coupled to a metal fill (capacitor portion filled with metal) that bleeds the charge from a capacitor. Therefore, the second multiplexor switch 406-2 can also be referred to as a bleeder thin film transistor (TFT).

Applying a voltage to the first multiplexor gate 714-1 can activate the first multiplexor switch 706-1. Each first multiplexor switch 706-1 can be coupled to a respective first horizontal sense line 713-1. Coupling the first multiplexor switch 706-1 to the first horizontal sense line 713-1 selects the vertical sense line 703-1.

In some embodiments, multiplexor control circuitry 736-1 and 736-2 is formed on a substrate material 700 below the multiplexor gates and outside of the vertical sense lines 703. The multiplexor control circuitry 736 can cause the multiplexor switches 706 to perform certain actions. For example, the multiplexor control circuitry 736 can activate a particular multiplexor switch to couple to a horizontal sense line 713 to a vertical sense line. The first multiplexor gate 714-1 and the second multiplexor gate 714-2 have separate multiplexor control circuitry 736. For example, the second multiplexor control circuitry 736-2 controls the first multiplexor gate 714-1 and the first multiplexor control circuitry 736-1 controls the second multiplexor gate 714-2

In some embodiments, a plurality of sense amps 734 and sub-access line drivers 738-1 and 738-2 can also be formed on the substrate material 700 below and outside of the multiplexor gates 714 and the vertical sense lines 703. Each sense amp 734 can be coupled to a respective horizontal sense line 713 through conductive lines 726-14, . . . , 726-22 and the sub-access line drivers 738 can be coupled to the horizontal access lines 707 through conductive lines 726-1, 726-2, . . . , 726-11. The different sense amps 734 can be coupled to different respective subsets of the plurality of multiplexors via a different horizontal sense line 713. In some embodiments, the sub-access line drivers 738 can be used to drive voltage to the horizontal access lines 707.

A process for sensing a memory cell (e.g., memory cell 610 in FIG. 6) can include, among a respective plurality of horizontal access lines 707 coupled to each of a plurality of vertically stacked tiers of memory cells, activating a particular horizontal access line 707-1 coupled to the memory cell. The process can also include electrically coupling a vertical sense line 703-1 via a multiplexor (e.g., multiplexor 420 shown in FIG. 4) in the array of memory cells, wherein the vertical sense line 703-1 is coupled to the memory cell. Further, the process can include sensing the memory cell with a sense amp 734-1 in SuA circuitry, wherein the sense amp 734-1 is coupled to the horizontal sense line 713-1.

Prior to sensing the memory cell, a second vertical sense line 703-2 can be coupled to a second horizontal sense line 713-2 via a second multiplexor in the array of memory cells, wherein the second vertical sense line 703-2 is not coupled to the memory cell. The sense amp 734-2 may be coupled to the second horizontal sense line 703-2. Further, prior to sensing the memory cell, a plurality of other vertical sense lines 703 can be electrically decoupled from the horizontal sense line 713. In some embodiments, coupling the vertical sense line 703 to the horizontal sense line 713 via a multiplexor comprises applying a signal to a gate 714 of a first transistor (e.g., first multiplexor switch) of a pair of transistors (e.g., multiplexor switches) comprising the multiplexor. The dotted line around multiplexor switches 706-1-1 and 706-2-1 is shown in more detail in FIG. 7B.

Figure 7B:
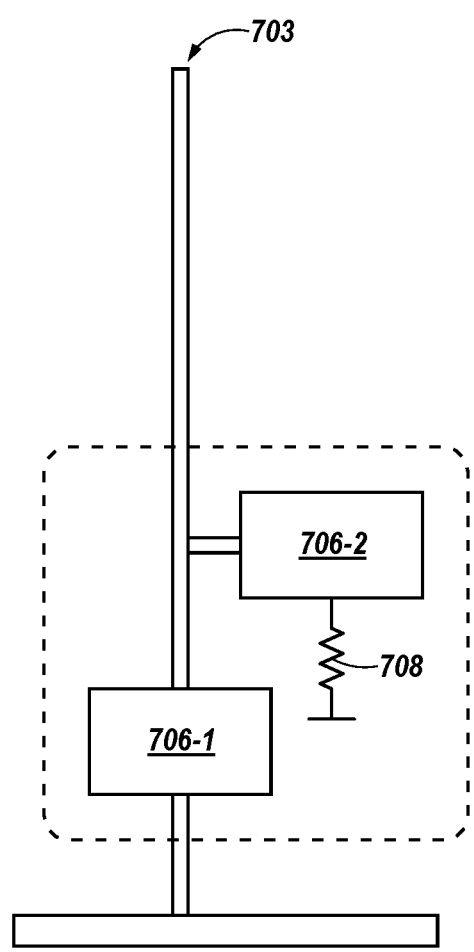
FIG. 7B is a block diagram illustrating a multiplexor for a semiconductor device, in accordance with a number of embodiments of the present disclosure.

FIG. 7B is a block diagram illustrating a multiplexor for a semiconductor device, in accordance with a number of embodiments of the present disclosure. FIG. 7B illustrates a more detailed view of how the multiplexor switches 706-1-1 and 706-2-1 are coupled to the vertical sense line 703-1. As shown in FIG. 7B, a first multiplexor switch 706-1 and a second multiplexor switch 706-2 can be coupled to the same vertical sense line 703. The second multiplexor switch 706-2 can be coupled to a second metal fill 708.

Figure 8:
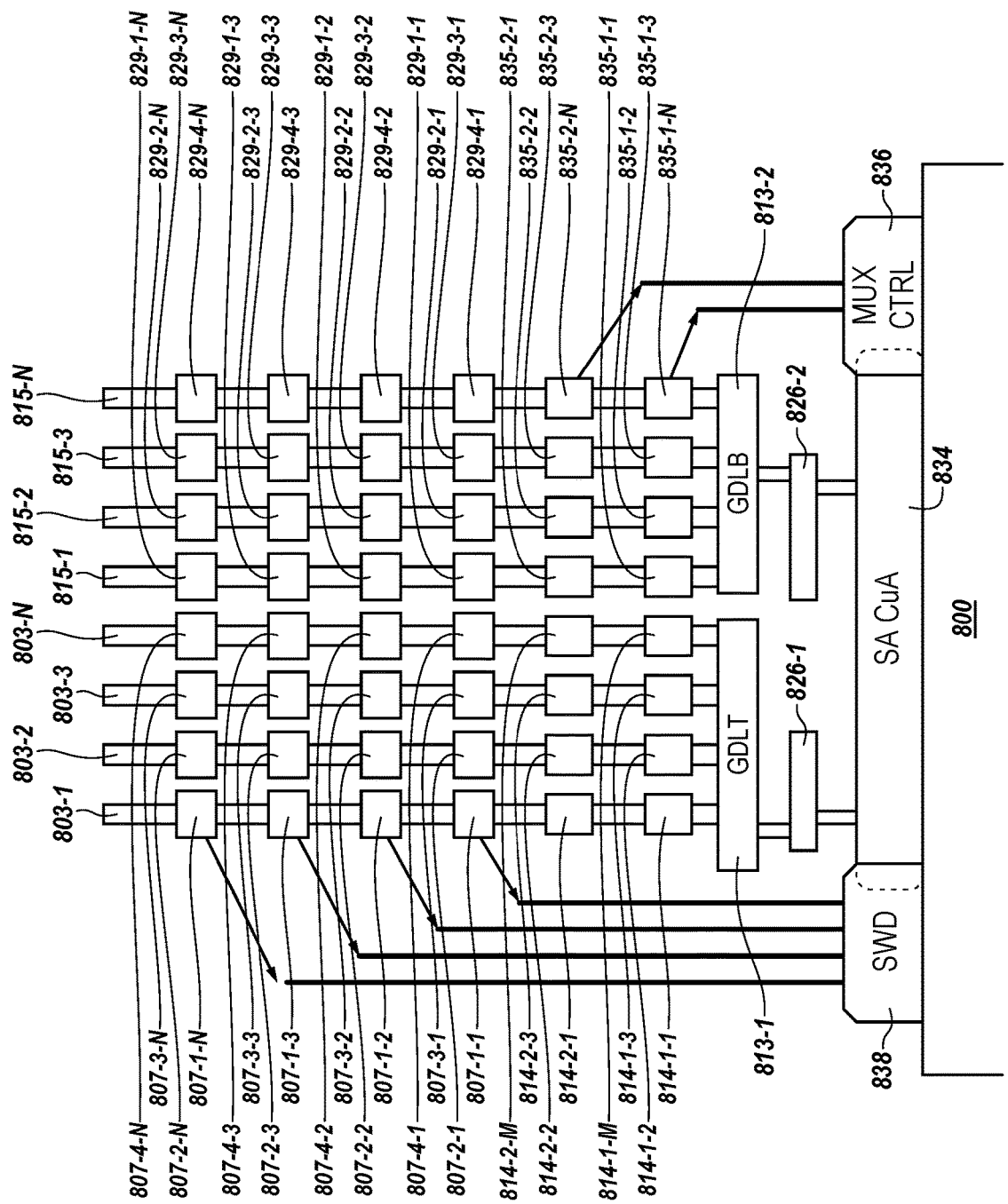
FIG. 8 is another cross-sectional view of a multiplexor for a semiconductor device, in accordance with a number of embodiments of the present disclosure.

FIG. 8 is another block diagram illustrating a multiplexor for a semiconductor device, in accordance with a number of embodiments of the present disclosure. As shown in FIG. 8, the semiconductor device can include vertical sense lines (local sense lines) 803-1, 803-2, 803-3, . . . , 803-N, reference sense lines 815-1, 815-2, 815-3, . . . , 815-N, first rows of horizontal access lines 807-1-1, 807-1-2, 807-1-3, . . . , 807-1-N, and second rows of horizontal access lines 829-1, 829-2, 829-3, . . . , 829-N. The first direction (D1) 809, the second direction (D2) 805, and the third direction (D3) 811 are analogous to the first direction (D1) 209, the second direction (D2) 205, and the third direction (D3) 211 of FIG. 2, respectively. FIG. 8 is illustrated at a x/z angle. The x-direction, the y-direction, and the z-direction in FIG. 8 is analogous to the x-direction, the y-direction, and the z-direction in FIG. 7A, respectively.

Each of a plurality of first multiplexor switches 806-1-1, 806-1-2, 806-1-3, . . . , 806-1-M and each of a plurality of second multiplexor switches 806-2-1, 806-2-2, 806-2-3, . . . , 806-2-M may be coupled to respective vertical sense lines 803. First terminals of each of the first multiplexor switches 806-1 can be coupled to respective vertical sense lines 803 and first terminals of each of the second multiplexors switches 806-2 can be coupled to those same respective vertical sense lines 803.

The first multiplexor switches 806-1 can be activated by applying a voltage to a gate of the first multiplexor switches 806-1 and the second multiplexor switches 806-2 can be activated by applying a voltage to a gate of the second multiplexor switches 806-2. Activating the first multiplexor switches 806-1 couples the first multiplexor switch 806-1, as well as the respective vertical sense line 803, to the horizontal sense line 813-1. Coupling a vertical sense line 803 to the horizontal sense line 813-1 selects that vertical sense line 803 and allows data stored in a memory cell coupled to that vertical sense line 803 to be transferred to outside circuitry through the horizontal sense line 813-1. Activating the second multiplexor switches 806-2 may deselect the respective vertical sense line 803 and drain a charge from a storage node coupled to a second terminal of a second multiplexor switch 806-2.

Each of a plurality of first reference multiplexor switches 814-1-1, 814-1-2, 814-1-3, . . . , 814-1-N and each of a plurality of second reference multiplexor switches 814-2-1, 814-2-2, 814-2-3, . . . , 814-2-N may be coupled to respective reference sense lines 815. First terminals of each of the first reference multiplexor switches 814-1 can be coupled to respective reference sense lines 815 and first terminals of each of the second reference multiplexor switches 814-2 can be coupled to those same respective reference sense lines 815.

The first reference multiplexor switches 814-1 and the second reference multiplexor switches 814-2 function the same as the first multiplexor switches 806-1 and the second multiplexor switches 806-2. For example, activating a first reference multiplexor switch 814-1 couples the respective reference sense line 815 to a horizontal sense line 813-2 and activating a second reference multiplexor switch 814-2 deselects the respective sense line 815 and drains a charge from a storage node coupled to a second terminal of the second reference multiplexor switch 814-2. In some embodiments, each horizontal sense line 813-1 and 813-2 in each respective pair of horizontal sense lines 813 is coupled to the same sense amp 834.

In some embodiments, a sense amp 834, multiplexor control circuitry 836, and sub-access line driver circuitry 838 can be formed on a substrate material 800. As shown in FIG. 8, the sense amp 834, the multiplexor control circuitry 836, and the sub-access line driver circuitry 838 can be SuA circuitry that is built under a vertical stack that includes multiplexor switches 806 and 814 of a multiplexor portion of the vertical stack and the horizontal sense lines 813 coupled to the first multiplexor switches 806-1 and reference multiplexor switches 814-1. In some embodiments, the horizontal sense line 813-1 may be coupled to the sense amp 834 through conductive line 826-1 and the reference horizontal sense line 813-2 may be coupled to that same sense amp 834 through conductive line 826-2.

Figure 9:
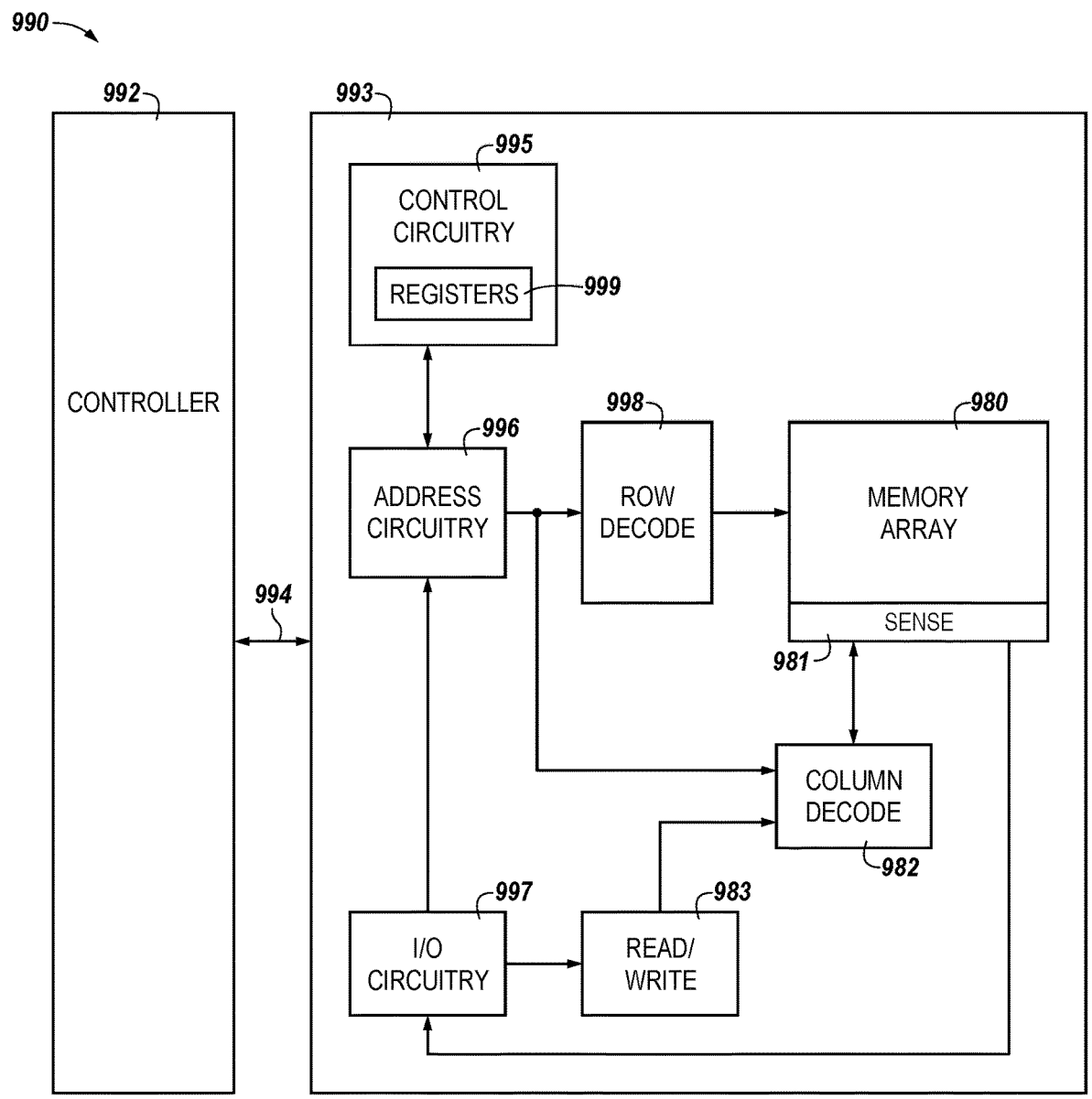
FIG. 9 is a block diagram of an apparatus in the form of a computing system including a memory device, in accordance with a number of embodiments of the present disclosure.

FIG. 9 is a block diagram of an apparatus in the form of a computing system 990 including a memory device 993 in accordance with a number of embodiments of the present disclosure. As used herein, a memory device 993, a memory array 980, and/or a host 992, for example, might also be separately considered an "apparatus."

In this example, system 990 includes a host 992 coupled to memory device 993 via an interface 994. The computing system 990 can be a personal laptop computer, a desktop computer, a digital camera, a mobile telephone, a memory card reader, or an Internet-of-Things (IoT) enabled device, among various other types of systems. Host 992 can include a number of processing resources (e.g., one or more processors, microprocessors, or some other type of controlling circuitry) capable of accessing the memory device 993. The system 990 can include separate integrated circuits, or both the host 992 and the memory device 993 can be on the same integrated circuit. For example, the host 992 may be a system controller of a memory system comprising multiple memory devices 993, with the system controller 995 providing access to the respective memory devices 993 by another processing resource such as a central processing unit (CPU).

In the example shown in FIG. 9, the host 992 is responsible for executing an operating system (OS) and/or various applications (e.g., processes) that can be loaded thereto (e.g., from memory device 993 via controller 995). The OS and/or various applications can be loaded from the memory device 993 by providing access commands from the host 992 to the memory device 993 to access the data comprising the OS and/or the various applications. The host 992 can also access data utilized by the OS and/or various applications by providing access commands to the memory device 993 to retrieve said data utilized in the execution of the OS and/or the various applications.

For clarity, the system 990 has been simplified to focus on features with particular relevance to the present disclosure. The memory array 980 can be a DRAM array comprising at least one memory cell having a sense line and body contact formed according to the techniques described herein. For example, the memory array 980 can be an unshielded DL 4F2 array such as a 3D-DRAM memory array. The memory array 980 can comprise memory cells arranged in rows coupled by access lines (which may be referred to herein as word lines or select lines) and columns coupled by sense lines (which may be referred to herein as digit lines or data lines). Although a single array 980 is shown in FIG. 9, embodiments are not so limited. For instance, memory device 993 may include a number of arrays 980 (e.g., a number of banks of DRAM cells).

The memory device 993 includes address circuitry 996 to latch address signals provided over an interface 994. The interface can include, for example, a physical interface employing a suitable protocol (e.g., a data bus, an address bus, and a command bus, or a combined data/address/command bus). Such protocol may be custom or proprietary, or the interface 994 may employ a standardized protocol, such as Peripheral Component Interconnect Express (PCIe), Gen-Z, CCIX, or the like. Address signals are received and decoded by a row decoder 998 and a column decoder 982 to access the memory array 980. Data can be read from memory array 980 by sensing voltage and/or current changes on the sense lines using sensing circuitry 981. The sensing circuitry 981 can comprise, for example, sense amplifiers that can read and latch a page (e.g., row) of data from the memory array 980. The I/O circuitry 997 can be used for bi-directional data communication with the host 992 over the interface 994. The read/write circuitry 983 is used to write data to the memory array 980 or read data from the memory array 980. As an example, the circuitry 983 can comprise various drivers, latch circuitry, etc.

Control circuitry 995 includes registers 999 and decodes signals provided by the host 992. The signals can be commands provided by the host 992. These signals can include chip enable signals, write enable signals, and address latch signals that are used to control operations performed on the memory array 980, including data read operations, data write operations, and data erase operations. In various embodiments, the control circuitry 995 is responsible for executing instructions from the host 992. The control circuitry 995 can comprise a state machine, a sequencer, and/or some other type of control circuitry, which may be implemented in the form of hardware, firmware, or software, or any combination of the three. In some examples, the host 992 can be a controller external to the memory device 993. For example, the host 992 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
an array of memory cells comprising:
a plurality of vertically stacked tiers of memory cells;
a respective plurality of horizontal access lines coupled to each of the plurality of tiers;
a plurality of vertical sense lines coupled to each of the plurality of tiers; and
a plurality of multiplexors each coupled to a respective vertical sense line and configured to electrically couple the respective vertical sense line to a horizontal sense line; and semiconductor under the array (SuA) circuitry, comprising a plurality of sense amplifiers, each sense amplifier coupled to a respective subset of the plurality of multiplexors, wherein the respective multiplexor comprises:
a first multiplexor switch comprising a first terminal having a first vertical thickness, the first terminal coupled to the respective horizontal sense line; and
a second multiplexor switch comprising a second terminal having a second vertical thickness less than the first vertical thickness, the second terminal coupled to a vertical portion of a storage node.

2. The memory device of claim 1, wherein each multiplexor is coupled between the plurality of vertically stacked tiers and the respective horizontal sense line via the respective vertical sense line; and
wherein the respective horizontal sense line is coupled to a particular sense amplifier.

3. The memory device of claim 1, wherein the SuA circuitry further comprises control circuitry coupled to the plurality of multiplexors and configured to cause the respective multiplexor to electrically couple the respective vertical sense line to the respective horizontal sense line.

4. The memory device of claim 1, wherein the second terminal includes a metal fill.

5. The memory device of claim 1, wherein the first terminal has a higher resistance than the second terminal.

6. The memory device of claim 1, wherein the first multiplexor switch further comprises a first gate;
wherein the second multiplexor switch further comprises a second gate; and
wherein the first gate and the second gate run parallel to and vertically in line with a respective horizontal access line in each of the plurality of tiers.

7. The memory device of claim 6, wherein the first terminal and the second terminal run parallel to and vertically in line with a plurality of storage nodes in a particular vertical stack of memory cells.

8. The memory device of claim 1, wherein the first multiplexor switch and the second multiplexor switch are coupled to the respective vertical sense line.

9. The memory device of claim 1, wherein different sense amplifiers are coupled to different respective subsets of the plurality of multiplexors via a different horizontal sense line.

10. The memory device of claim 1, wherein multiplexor control circuitry to execute instructions for the plurality of multiplexors is formed on a substrate material below the plurality of multiplexors.

11. The memory device of claim 10, wherein the first multiplexor switch and second multiplexor switch of each multiplexor have separate multiplexor control circuitry.

12. The memory device of claim 1, wherein each horizontal sense line in each respective pair of horizontal sense lines is coupled to a same sense amplifier.

13. A method of operating a memory device, comprising:
activating a vertical sense line coupled to a vertical stack of the memory device;
activating a second multiplexor switch of a multiplexor portion of the vertical stack to drain a charge from a storage node of the vertical stack, wherein a first terminal of the second multiplexor switch is coupled to the vertical sense line and a second terminal of the second multiplexor switch is coupled to a vertical portion of the storage node of the vertical stack; and
activating a first multiplexor switch of the multiplexor portion of the vertical stack to select the vertical sense line, wherein a first terminal of the first multiplexor switch is coupled to the vertical sense line and a second terminal of the first multiplexor switch is coupled to the horizontal sense line.

14. The method of claim 13, further comprising activating the second multiplexor switch of the multiplexor portion of the vertical stack to deselect the vertical sense line.

15. The method of claim 14, further comprising receiving, by the multiplexor portion of the vertical stack, a higher magnitude of voltage from the horizontal sense line coupled to the first multiplexor switch than a magnitude of voltage received from the vertical sense line coupled to the first multiplexor switch and the second multiplexor switch.

16. A method of sensing a memory cell in an array of memory cells, comprising:
among a respective plurality of horizontal access lines coupled to each of a plurality of vertically stacked tiers of memory cells, activating a particular horizontal access line coupled to the memory cell;
electrically coupling a vertical sense line to a horizontal sense line via a multiplexor in the array of memory cells, wherein the vertical sense line is coupled to the memory cell; and
sensing the memory cell with a sense amplifier in semiconductor under the array (SuA) circuitry, wherein the sense amplifier is coupled to the horizontal sense line.

17. The method of claim 16, wherein the vertical sense line comprises a first vertical sense line, the horizontal sense line comprises a first horizontal sense line, and the multiplexor comprises a first multiplexor;
wherein the method further comprises, prior to sensing the memory cell, electrically coupling a second vertical sense line to a second horizontal sense line via a second multiplexor in the array of memory cells, wherein the second vertical sense line is not coupled to the memory cell; and
wherein the sense amplifier is coupled to the second horizontal sense line.

18. The method of claim 16 further comprising, prior to sensing the memory cell, electrically decoupling a plurality of other vertical sense lines from the horizontal sense line.

19. The method of claim 16, wherein electrically coupling the vertical sense line to the horizontal sense line via the multiplexor comprises applying a signal to a gate of a first transistor of a pair of transistors comprising the multiplexor.

20. A memory device, comprising:
- an array of memory cells comprising:
  - a plurality of vertically stacked tiers of memory cells;
  - a respective plurality of horizontal access lines coupled to each of the plurality of tiers;
  - a plurality of vertical sense lines coupled to each of the plurality of tiers; and
  - a plurality of multiplexors each coupled to a respective vertical sense line and configured to electrically couple the respective vertical sense line to a horizontal sense line; and semiconductor under the array (SuA) circuitry, comprising a plurality of sense amplifiers, each sense amplifier coupled to a respective subset of the plurality of multiplexors;
- wherein the SuA circuitry further comprises control circuitry coupled to the plurality of multiplexors and configured to cause the respective multiplexor to electrically couple the respective vertical sense line to the respective horizontal sense line.

* * * * *